US011070195B2

(12) United States Patent
Uesaka

(10) Patent No.: US 11,070,195 B2
(45) Date of Patent: Jul. 20, 2021

(54) ACOUSTIC WAVE FILTER AND MULTIPLEXER

(71) Applicant: Murata Manufacturing Co., Ltd., Nagaokakyo (JP)

(72) Inventor: Kenichi Uesaka, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 88 days.

(21) Appl. No.: 16/672,564

(22) Filed: Nov. 4, 2019

(65) Prior Publication Data

US 2020/0212890 A1 Jul. 2, 2020

(30) Foreign Application Priority Data

Dec. 28, 2018 (JP) ............... JP2018-247590

(51) Int. Cl.
*H03H 9/64* (2006.01)
*H03H 9/02* (2006.01)
(Continued)

(52) U.S. Cl.
CPC ...... *H03H 9/6496* (2013.01); *H03H 9/02559* (2013.01); *H03H 9/02637* (2013.01);
(Continued)

(58) Field of Classification Search
CPC ............. H03H 9/6496; H03H 9/02559; H03H 9/02637; H03H 9/02834; H03H 9/725; H03H 9/02992; H03H 9/14541; H03H 9/14582; H03H 9/25; H03H 9/02937; H03H 9/6436
(Continued)

(56) References Cited

U.S. PATENT DOCUMENTS 5,963,114 A 10/1999 Ueda et al.
6,853,269 B2 * 2/2005 Nakamura ........... H03H 9/0061
310/313 B
(Continued)

FOREIGN PATENT DOCUMENTS

JP 09-321574 A 12/1997
JP 2002-084163 A 3/2002
WO 2018/037884 A1 3/2018

*Primary Examiner* — Robert J Pascal
*Assistant Examiner* — Jorge L Salazar, Jr.
(74) *Attorney, Agent, or Firm* — Keating & Bennett, LLP

(57) ABSTRACT

An acoustic wave filter includes a piezoelectric substrate, first and second input-output terminals, and a longitudinally coupled resonator unit in a path connecting the first and second input-output terminals to each other, and the resonator unit includes five or more interdigital transducer electrodes aligned in an acoustic wave propagation direction, the IDT electrodes include a center IDT electrode at the center in the propagation direction and first and second IDT electrodes at symmetric or substantially symmetric positions in the propagation direction with respect to the center IDT electrode, each of the first and second IDT electrodes includes a main pitch portion and a pair of narrow-pitch portions provided between the main pitch portion and both ends of the IDT electrode in the propagation direction, and the first and second IDT electrodes differ from each other in the number of electrode fingers of the main pitch portion.

17 Claims, 8 Drawing Sheets

(51) Int. Cl.
  *H03H 9/145* (2006.01)
  *H03H 9/72* (2006.01)
  *H03H 9/25* (2006.01)
(52) U.S. Cl.
  CPC .... *H03H 9/02834* (2013.01); *H03H 9/02937* (2013.01); *H03H 9/02992* (2013.01); *H03H 9/14541* (2013.01); *H03H 9/14582* (2013.01); *H03H 9/25* (2013.01); *H03H 9/725* (2013.01)
(58) Field of Classification Search
  USPC .......................................... 333/133, 193–196
  See application file for complete search history.

(56) References Cited

U.S. PATENT DOCUMENTS

| | | |
|---|---|---|
| 2002/0000898 A1 | 1/2002 | Takamine |
| 2019/0190480 A1 | 6/2019 | Nakamura |

\* cited by examiner

FIG. 4

NUMBER OF ELECTRODE FINGERS

| | REFLECTOR 21 | IDT ELECTRODE 33 | | IDT ELECTRODE 31 (FIRST IDT ELECTRODE) | | IDT ELECTRODE 30 (CENTER IDT ELECTRODE) | | | IDT ELECTRODE 32 (SECOND IDT ELECTRODE) | | | IDT ELECTRODE 34 | | REFLECTOR 22 |
|---|---|---|---|---|---|---|---|---|---|---|---|---|---|---|
| | | MAIN PITCH PORTION | NARROW-PITCH PORTION | NARROW-PITCH PORTION | MAIN PITCH PORTION | NARROW-PITCH PORTION | MAIN PITCH PORTION | NARROW-PITCH PORTION | NARROW-PITCH PORTION | MAIN PITCH PORTION | NARROW-PITCH PORTION | NARROW-PITCH PORTION | MAIN PITCH PORTION | |
| COMPARATIVE EXAMPLE | 80 | 32 | 9 | 7 | 44 | 8 | 37 | 8 | 7 | 44 | 7 | 9 | 32 | 80 |
| FIRST EMBODIMENT | 80 | 32 | 9 | 7 | 38 | 8 | 37 | 8 | 7 | 50 | 7 | 9 | 32 | 80 |

ACOUSTIC WAVE FILTER AND MULTIPLEXER

CROSS REFERENCE TO RELATED APPLICATIONS

This application claims the benefit of priority to Japanese Patent Application No. 2018-247590 filed on Dec. 28, 2018. The entire contents of this application are hereby incorporated herein by reference.

BACKGROUND OF THE INVENTION

1. Field of the Invention

The present invention relates to an acoustic wave filter and a multiplexer.

2. Description of the Related Art

Hitherto, in a communication apparatus such as a cellular phone, an acoustic wave filter such as a longitudinally coupled resonator surface acoustic wave (SAW) filter or a ladder SAW filter has been used. For example, International Publication No. 2018/037884 discloses an acoustic wave device using a longitudinally coupled resonator SAW filter.

A multiplexer is known as a device for a communication apparatus using an acoustic wave filter. In such a multiplexer, a plurality of acoustic wave filters corresponding to a plurality of respective frequency bands are used, and spurious responses that occur outside the pass band of each acoustic wave filter may cause a problem. For example, in a case where a spurious response of one of the acoustic wave filters occurs in the pass band of another one of the acoustic wave filters, bandpass characteristics in the pass band of the multiplexer may be degraded.

SUMMARY OF THE INVENTION

Preferred embodiments of the present invention provide longitudinally coupled acoustic wave filters that are each able to significantly reduce or prevent spurious responses.

An acoustic wave filter according to a preferred embodiment of the present invention includes a piezoelectric substrate, a first input-output terminal and a second input-output terminal that are provided on the substrate, and a longitudinally coupled resonator unit that is provided on the substrate and is provided in a path connecting the first input-output terminal and the second input-output terminal to each other. The longitudinally coupled resonator unit includes five or more IDT electrodes that are aligned in a propagation direction in which a predetermined acoustic wave propagates on the substrate, each of the five or more IDT electrodes includes a pair of substantially comb-shaped electrodes, the five or more IDT electrodes include a center IDT electrode located at or substantially at a center in the propagation direction and a first IDT electrode and a second IDT electrode located at symmetric or substantially symmetric positions with respect to the center IDT electrode in the propagation direction, each of the five or more IDT electrodes includes a main pitch portion, which includes an electrode finger provided at a position closest to a center in the propagation direction among a plurality of electrode fingers included in the IDT electrode and extending in a direction crossing the propagation direction, each of the first IDT electrode and the second IDT electrode includes a pair of narrow-pitch portions each including, among the plurality of electrode fingers, electrode fingers provided between the main pitch portion and a corresponding one of both ends of the IDT electrode in the propagation direction and having a narrower pitch than the main pitch portion, and the first IDT electrode and the second IDT electrode differ from each other in terms of the number of electrode fingers included in the main pitch portion.

Consequently, the spurious responses of the acoustic wave filter are able to be significantly reduced or prevented. The reason for achieving this advantageous effect is assumed as follows. In order to describe the advantageous effect of the preferred embodiments of the present invention, as a comparative example, an acoustic wave filter that includes five or more IDT electrodes similarly to as in preferred embodiments of the present invention and in which main pitch portions of a first IDT electrode and a second IDT electrode located at symmetric or substantially symmetric positions in an acoustic wave propagation direction with respect to a center IDT electrode have identical numbers of electrode fingers will be described. In the acoustic wave filter according to the comparative example, spurious responses having substantially the same frequency characteristics occur at the first IDT electrode and the second IDT electrode, and these spurious responses reinforce each other. Thus, relatively large spurious responses occur in the acoustic wave filter according to the comparative example. In contrast to this, in the acoustic wave filters according to preferred embodiments of the present invention, the number of electrode fingers of the main pitch portion of the first IDT electrode is different from that of the second IDT electrode, the first and second IDT electrodes being located at symmetric or substantially symmetric positions with respect to the center IDT electrode in the acoustic wave propagation direction. Thus, the frequency characteristics of spurious responses that occur at the first IDT electrode may be different from those at the second IDT electrode. Consequently, spurious responses occurring at the first IDT electrode and the second IDT electrode can be prevented from reinforcing each other, and thus it is considered that the spurious responses of the acoustic wave filter are able to be significantly reduced or prevented.

In addition, an acoustic wave filter according to a preferred embodiment of the present invention may further include one or more ground wires provided on the substrate, one of the pair of substantially comb-shaped electrodes may be connected to the path, and the other one of the pair of substantially comb-shaped electrodes may be connected to at least one of the one or more ground wires.

As a result, acoustic wave filters according to preferred embodiments of the present invention define unbalanced acoustic wave filters. Generally, signals outside the pass band and in two signal lines may be canceled out in a balanced acoustic wave filter. However, such signals are not canceled out in an unbalanced acoustic wave filter. Accordingly, in an unbalanced acoustic wave filter in which spurious responses become relatively large, the spurious response reducing effect according to the preferred embodiments of the present invention is especially prominent.

In addition, in an acoustic wave filter according to a preferred embodiment of the present invention, the substrate may be made of $LiNbO_3$.

Accordingly, in an acoustic wave filter whose substrate made of $LiNbO_3$ and that uses an LN Rayleigh wave, spurious responses may occur on the high-frequency side of the pass band. However, such spurious responses are able to be significantly reduced or prevented with configurations according to preferred embodiments of the present invention.

In addition, in an acoustic wave filter according to a preferred embodiment of the present preferred embodiment, the difference between the number of electrode fingers included in the main pitch portion of the first IDT electrode and that of the second IDT electrode may be an even number.

As a result, the difference between the numbers of electrode fingers of the main pitch portions of the first and second IDT electrodes may correspond to an integral multiple of the wavelength of an acoustic wave resonator including the IDT electrodes. Thus, the differences between the frequency characteristics in the pass band of the first IDT electrode and those of the second IDT electrode are able to be significantly reduced.

In addition, in an acoustic wave filter according to a preferred embodiment of the present preferred embodiment, the parameters for the first IDT electrode may be the same or substantially the same as those for the second IDT electrode except for the number of electrode fingers included in the main pitch portion.

As a result, an acoustic wave filter having a symmetric configuration with respect to the center IDT electrode except for the numbers of electrode fingers of the main pitch portions of the first and second IDT electrodes can be obtained. Thus, the spurious responses are able to be significantly reduced or prevented almost without degrading the bandpass characteristics compared with an acoustic wave filter designed to be perfectly symmetric with respect to the center IDT electrode.

In addition, in an acoustic wave filter according to a preferred embodiment of the present invention, the numbers of electrode fingers included in the main pitch portions of a pair of IDT electrodes may be equal to each other, the IDT electrodes being provided as a pair at both ends of the five or more IDT electrodes in the propagation direction.

As a result, the bandpass characteristics of the acoustic wave filter may be closer to the bandpass characteristics of an acoustic wave filter designed to be perfectly symmetric with respect to the center IDT electrode.

In addition, a multiplexer according to a preferred embodiment of the present invention includes an acoustic wave filter described above and a frequency filter whose pass band is on the higher frequency side of a pass band of the acoustic wave filter.

For example, in a case where the substrate of the acoustic wave filter is made of $LiNbO_3$, spurious responses may occur on the high-frequency side of the pass band. However, the spurious responses are able to be significantly reduced or prevented by using the acoustic wave filter described above. Thus, with the multiplexer according to a preferred embodiment of the present invention, degradation of bandpass characteristics in the pass band that is on the higher frequency side of the pass band of the acoustic wave filter is able to be significantly reduced or prevented.

According to preferred embodiments of the present invention, for example, longitudinally coupled acoustic wave filters that are each able to significantly reduce or prevent spurious responses can be provided.

The above and other elements, features, steps, characteristics and advantages of the present invention will become more apparent from the following detailed description of the preferred embodiments with reference to the attached drawings.

BRIEF DESCRIPTION OF THE DRAWINGS

FIG. 4 is a table showing the numbers of electrode fingers included in the longitudinally coupled resonator unit of the acoustic wave filter according to the first preferred embodiment of the present invention.

DETAILED DESCRIPTION OF THE PREFERRED EMBODIMENTS

In the following, preferred embodiments of the present invention will be described in detail with reference to the drawings. Note that any of the preferred embodiments to be described below does not indicate a general or specific example. Numerical values, shapes, materials, structural elements, and arrangement and connection configurations of the structural elements shown in the following preferred embodiments are examples, and it is not intended to limit the present invention. Among the structural elements in the following preferred embodiments, structural elements that are not described in independent claims will be described as optional or arbitrary structural elements. In addition, the sizes of and the size ratios between the structural elements are not always precise.

First Preferred Embodiment

An acoustic wave filter according to a first preferred embodiment of the present invention will be described.

1-1. Overall Configuration of Acoustic Wave Filter

Figure 1:
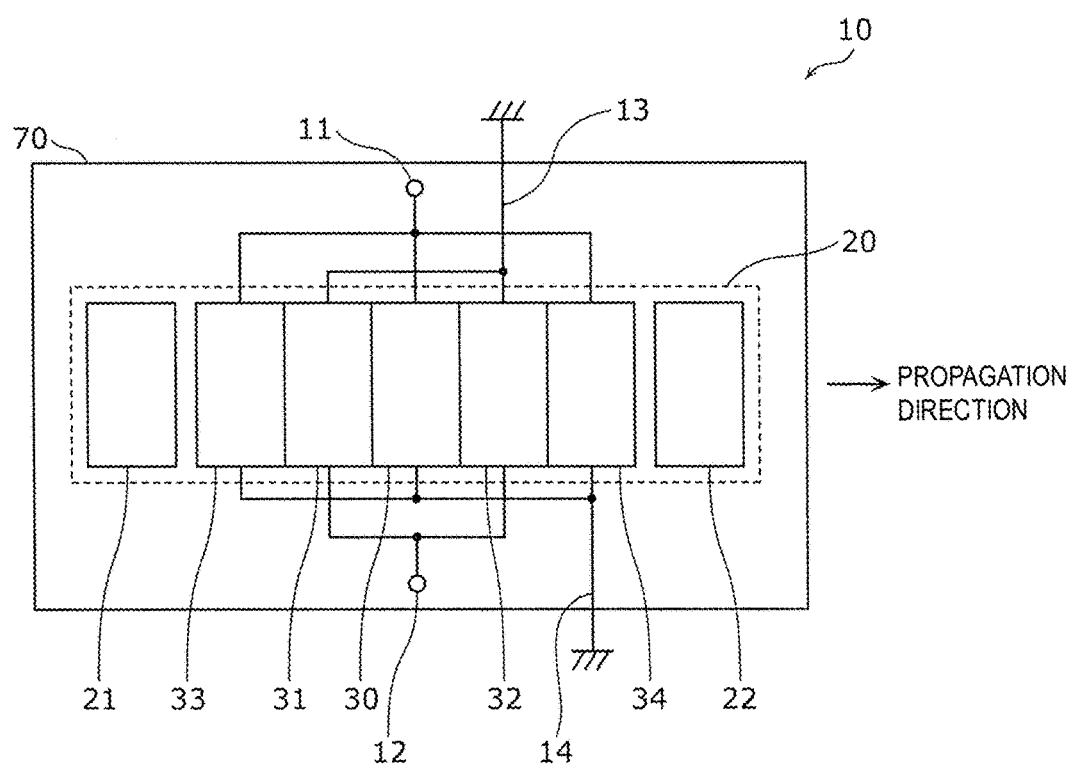
FIG. 1 is a plan view showing a circuit configuration of an acoustic wave filter according to a first preferred embodiment of the present invention.

First, the overall configuration of an acoustic wave filter according to the first preferred embodiment will be described using FIG. 1. FIG. 1 is a plan view showing a circuit configuration of an acoustic wave filter 10 according to the first preferred embodiment.

As shown in FIG. 1, the acoustic wave filter 10 includes a substrate 70, a first input-output terminal 11, a second input-output terminal 12, and a longitudinally coupled resonator unit 20. In the first preferred embodiment, the acoustic wave filter 10 further includes ground wires 13 and 14.

The substrate 70 is preferably a plate shaped piezoelectric member, for example. In the first preferred embodiment, the substrate 70 preferably includes, for example, $LiNbO_3$. More specifically, the substrate 70 is preferably a piezoelectric single crystal substrate made of $LiNbO_3$. In a case where the substrate 70 is used, the acoustic wave filter 10 according to the first preferred embodiment can use an LN Rayleigh wave.

The first input-output terminal 11 and the second input-output terminal 12 are input-output terminals of the acoustic wave filter 10, which are provided on the substrate 70.

The ground wires 13 and 14 are wires connected to the ground, are provided on the substrate 70, and are insulated from the first input-output terminal 11 and the second input-output terminal 12. Note that, in the first preferred embodiment, the acoustic wave filter 10 includes the two ground wires 13 and 14. However, the acoustic wave filter 10 may include one ground wire or three or more ground wires. That is, it is sufficient that the acoustic wave filter 10 includes one or more ground wires.

The longitudinally coupled resonator unit 20 is an electrode provided on the substrate 70 and in a path connecting the first input-output terminal 11 and the second input-output terminal 12 to each other. The longitudinally coupled resonator unit 20 preferably includes, for example, five or more interdigital transducer (IDT) electrodes that are aligned in a propagation direction in which a predetermined acoustic wave propagates on the substrate 70. In the first preferred embodiment, as shown in FIG. 1, the longitudinally coupled resonator unit 20 includes five IDT electrodes 30 to 34 and two reflectors 21 and 22. The IDT electrodes 30 to 34 and the reflectors 21 and 22 are arranged in the acoustic wave propagation direction in the order of the reflector 21, the IDT electrodes 33, 31, 30, 32, and 34, and the reflector 22.

With the above-described configuration, the longitudinally coupled resonator unit 20 mainly defines insertion loss in the pass band of the acoustic wave filter 10 and attenuation near the pass band.

Note that the number of IDT electrodes included in the longitudinally coupled resonator unit 20 is not limited to five, and five or more IDT electrodes are sufficient.

Figure 2:
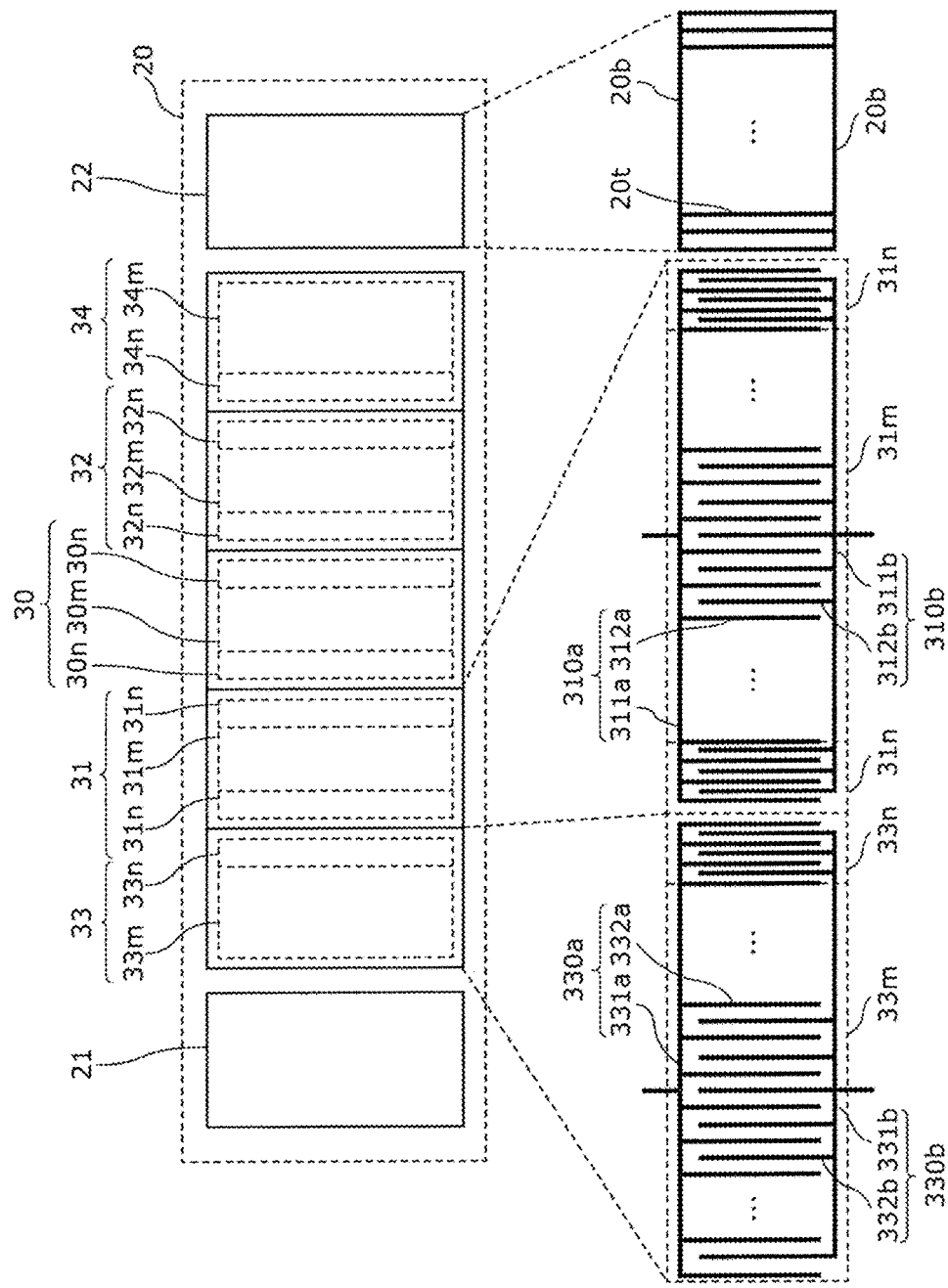
FIG. 2 is a plan view showing the overall configuration of a longitudinally coupled resonator unit according to the first preferred embodiment of the present invention.
Figure 3A:
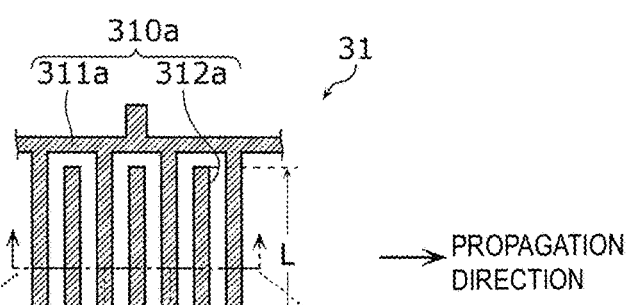
FIGS. 3A and 3B are diagrams showing a detailed configuration of an electrode of the longitudinally coupled resonator unit according to the first preferred embodiment of the present invention.
Figure 3B:
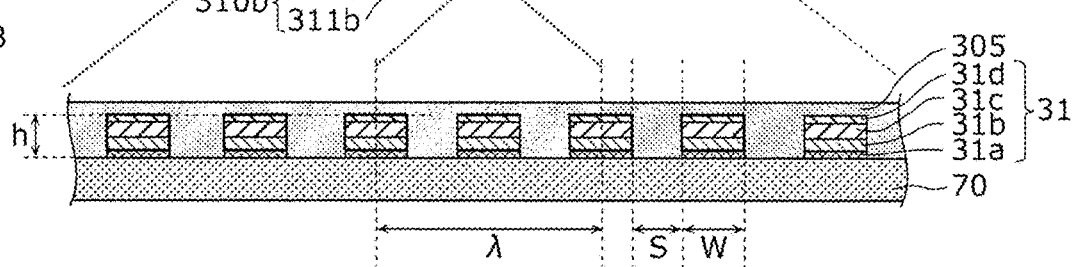

In the following, a detailed configuration of the longitudinally coupled resonator unit 20 according to the first preferred embodiment will be described using FIGS. 2, 3A, and 3B. FIG. 2 is a plan view showing an overall configuration of the longitudinally coupled resonator unit 20 according to the first preferred embodiment. FIG. 2 shows, as a typical example, only an electrode configuration of the IDT electrodes 31 and 33 and the reflector 22 among the IDT electrodes 30 to 34 and the reflectors 21 and 22. FIGS. 3A and 3B are diagrams showing a detailed configuration of an electrode of the longitudinally coupled resonator unit 20 according to the first preferred embodiment. FIG. 3A is a plan view of the IDT electrode 31 when the substrate 70 of the acoustic wave filter 10 is viewed in a plan view. FIG. 3B is a cross section taken along an alternate-long-and-short-dash line shown in FIG. 3A (plan view). Note that the IDT electrode 31 shown in FIGS. 3A and 3B is used to describe a typical configuration of an IDT electrode included in the longitudinally coupled resonator unit 20, and for example the length of the electrode fingers of the electrode and an electrode finger pitch are not limited to those of the configuration shown in FIGS. 3A and 3B.

Each of the IDT electrodes 30 to 34 includes a pair of substantially comb-shaped electrodes. As shown in FIG. 2, for example, the IDT electrode 31 includes a pair of substantially comb-shaped electrodes 310a and 310b, and the IDT electrode 33 includes a pair of substantially comb-shaped electrodes 330a and 330b. The other IDT electrodes 30, 32 and 34 include a pair of substantially comb-shaped electrodes, similarly to the IDT electrode 31 and the IDT electrode 33.

Each of the pair of substantially comb-shaped electrodes includes a plurality of electrode fingers extending in a direction crossing the propagation direction and a busbar electrode that connects one-side ends of the plurality of electrode fingers to each other. For example, as shown in FIG. 2 and FIG. 3A (plan view), the substantially comb-shaped electrode 310a includes a plurality of electrode fingers 312a and a busbar electrode 311a, and the substantially comb-shaped electrode 310b includes a plurality of electrode fingers 312b and a busbar electrode 311b. In addition, as shown in FIG. 2, the substantially comb-shaped electrode 330a includes a plurality of electrode fingers 332a and a busbar electrode 331a, and the substantially comb-shaped electrodes 330b includes a plurality of electrode fingers 332b and a busbar electrode 331b.

In each pair of substantially comb-shaped electrodes, a plurality of electrode fingers face another plurality of electrode fingers so that the electrode fingers are interdigitated with each other, and one of the pair of substantially comb-shaped electrodes is connected to a path connecting the first input-output terminal 11 to the second input-output terminal 12. As shown in FIGS. 1 and 2, for example, for each of the IDT electrodes 30, 33 and 34, one of the pair of substantially comb-shaped electrodes of the IDT electrode is connected to the first input-output terminal 11. For each of the IDT electrodes 31 and 32, one of the pair of substantially comb-shaped electrodes of the IDT electrode is connected to the second input-output terminal 12. In addition, in the first preferred embodiment, the other one of the pair of substantially comb-shaped electrodes of each IDT electrode is connected to at least one of the ground wires 13 and 14. For example, for each of the IDT electrodes 30, 33, and 34, the other one of the pair of substantially comb-shaped electrodes of the IDT electrode is connected to the ground wire 14. For each of the IDT electrodes 31 and 32, the other one of the pair of substantially comb-shaped electrodes of the IDT electrode is connected to the ground wire 13. Accordingly, the acoustic wave filter 10 according to the first preferred embodiment is an unbalanced filter, and the first input-output terminal 11 and the second input-output terminal 12 are unbalanced signal terminals.

Each of the five or more IDT electrodes includes a main pitch portion including an electrode finger at a position closest to the center in the propagation direction among the plurality of electrode fingers included in the IDT electrode and extending in the direction crossing the propagation direction. In the first preferred embodiment, the IDT electrodes 30 to 34 include main pitch portions 30m to 34m, respectively.

The IDT electrodes 30 to 34 include a center IDT electrode disposed at the center or approximate center in the acoustic wave propagation direction. The number of IDT electrodes that is included in the longitudinally coupled resonator unit 20 may preferably be, for example, an odd number greater than or equal to five. In this case, the same number of IDT electrodes is provided on both sides of the center IDT electrode in the propagation direction. In the first preferred embodiment, the IDT electrodes 30 to 34 include the IDT electrode 30 as the center IDT electrode.

The IDT electrodes 30 to 34 include a first IDT electrode and a second IDT electrode at symmetric positions with respect to the center IDT electrode in the propagation direction. In the first preferred embodiment, the IDT electrodes 30 to 34 include the IDT electrode 31 as the first IDT electrode and the IDT electrode 32 as the second IDT electrode.

Each of the first IDT electrode and the second IDT electrode includes a pair of narrow-pitch portions each of which includes, among the plurality of electrode fingers, electrode fingers between the main pitch portion and a corresponding one of both ends of the IDT electrode in the propagation direction and that has a narrower pitch than the main pitch portion. For example, the IDT electrode 31, which is the first IDT electrode, includes a pair of narrow-pitch portions 31n between a main pitch portion 31m and both ends of the IDT electrode 31 in the propagation direction. The IDT electrode 32, which is the second IDT electrode, includes a pair of narrow-pitch portions 32n between a main pitch portion 32m and both ends of the IDT electrode 32 in the propagation direction. Note that the pitches of the IDT electrodes will be described later.

In addition, the first IDT electrode and the second IDT electrode differ from each other in terms of the number of electrode fingers included in the main pitch portion. That is, the number of electrode fingers included in the main pitch portion 31m of the IDT electrode 31, which is the first IDT electrode, differs from the number of electrode fingers included in the main pitch portion 32m of the IDT electrode 32, which is the second IDT electrode. In the first preferred embodiment, the parameters for the first IDT electrode are the same or substantially the same as those for the second IDT electrode except for the number of electrode fingers of the main pitch portion. Advantageous effects exhibited with the configuration of the first IDT electrode and that of the second IDT electrode will be described later.

In the first preferred embodiment, the IDT electrode 30, which is the center IDT electrode, includes a pair of narrow-pitch portions 30n, similarly to the IDT electrodes 31 and 32. The IDT electrode 33 includes a narrow-pitch portion 33n arranged between an end of the IDT electrode 33 on the side where the IDT electrode 30, the center IDT electrode, is provided and a main pitch portion 33m. The IDT electrode 34 includes a narrow-pitch portion 34n arranged between an end of the IDT electrode 34 on the side where the IDT electrode 30, the center IDT electrode, is provided and a main pitch portion 34m.

Accordingly, since each IDT electrode includes a narrow-pitch portion, the pass band width of the acoustic wave filter 10 can be widened.

In addition, in the first preferred embodiment, the IDT electrode 31 including the plurality of electrode fingers 312a and 312b and the busbar electrodes 311a and 311b has a multilayer structure. As shown in FIG. 3B (cross section), the IDT electrode 31 includes a first metal layer 31a, a second metal layer 31b, a third metal layer 31c, and a fourth metal layer 31d stacked in this order on a main surface of the substrate 70. The first metal layer 31a is not specifically limited. However, it is preferably a NiCr film having a thickness of about 10 nm, for example. The first metal layer 31a may also include a metal having better adhesion to the substrate 70 than the metal included in the second metal layer 31b. The second metal layer 31b is not specifically limited. However, it is preferably a Pt film having a thickness of about 31 nm, for example. The third metal layer 31c is not specifically limited. However, it is preferably a Ti film having a thickness of about 130 nm, for example. The fourth metal layer 31d is not specifically limited. However, it is preferably an AlCu film having a thickness of about 10 nm, for example.

A protective layer 305 covers the substantially comb-shaped electrodes 310a and 310b. The protective layer 305 is a layer that protects the IDT electrode 31 from the external environment, that adjusts frequency-temperature characteristics, and that increases moisture resistance. The protective layer 305 is preferably, for example, a dielectric film having silicon dioxide as the main ingredient. The protective layer 305 has, for example, a thickness of about 410 nm.

Note that the materials included in the IDT electrode 31 and the protective layer 305 are not limited to the above-described materials. Furthermore, the IDT electrode 31 does not always have to have the above-described multilayer structure. For example, the IDT electrode 31 may include a metal such as Ti, Al, Cu, Pt, Au, Ag, or Pd or an alloy of the metal, for example, and furthermore the IDT electrode 31 may be defined by a plurality of multilayer bodies including the above-described metal or alloy. In addition, the protective layer 305 does not always have to be provided.

Note that, for example, the cross-sectional configuration of the IDT electrode 31 among the IDT electrodes 30 to 34 is described above. However, the other IDT electrodes have the same or substantially the same cross-sectional configuration as the IDT electrode 31.

The reflectors 21 and 22 include, as shown in FIG. 2, a plurality of electrode fingers 20t and a busbar electrode 20b. The plurality of electrode fingers 20t are parallel or substantially parallel to each other, and the busbar electrode 20b connects the plurality of electrode fingers 20t to each other. The reflectors 21 and 22 are arranged at both ends of the longitudinally coupled resonator unit 20 in the acoustic wave propagation direction. The material and cross-sectional configuration of the plurality of electrode fingers 20t and the busbar electrode 20b included in the reflectors 21 and 22 are not specifically limited. The plurality of electrode fingers 20t and the busbar electrode 20b of the reflectors 21 and 22 may have the same substantially the same material and cross-sectional configuration as the plurality of electrode fingers and the busbar electrodes of the above-described IDT electrodes.

Here, an example of electrode parameters of each IDT electrode will be described using the IDT electrode 31 shown in FIGS. 3A and 3B.

The wavelength of an acoustic wave resonator including the IDT electrode 31 and the substrate 70 is defined by a wavelength Λ, which is a cycle period of the plurality of electrode fingers 312a or 312b included in the IDT electrode 31 shown in FIG. 3B (cross section). In addition, the pitch of the electrode fingers is one half the wavelength Λ. In a case where the line width of the electrode fingers 312a and 312b included in the substantially comb-shaped electrodes 310a and 310b is denoted by W and the space width (that is, a gap) between one of the electrode fingers 312a and an electrode finger 312b next to the electrode finger 312a is denoted by S, the pitch of the electrode fingers is defined as (W+S). In addition, as shown in FIG. 3A (plan view), an overlapping width L of the pair of substantially comb-shaped electrodes 310a and 310b is an overlapping electrode-finger length of the electrode fingers 312a and the electrode fingers 312b when viewed from the acoustic wave propagation direction. In addition, an electrode duty of each acoustic wave resonator is the line width occupancy of the plurality of electrode fingers 312$a$ and 312$b$. In other words, the electrode duty is the proportion of the line width to the value obtained by adding the line width and space width of the plurality of electrode fingers 312$a$ and 312$b$, and is defined as W/(W+S). In addition, the height of the substantially comb-shaped electrodes 310$a$ and 310$b$, that is, a film thickness is denoted by h. Parameters that determine the shape and size of the IDT electrode of the acoustic wave resonator, for example, the wavelength A, the overlapping width L, the electrode duty, and the film thickness h of the IDT electrode 31 described above are called electrode parameters. Note that, in the first preferred embodiment, each of the electrode parameters for the main pitch portion and the narrow-pitch portions of each IDT electrode is uniform. For example, the pitch or the like in one main pitch portion is uniform, and the pitch or the like in one narrow-pitch portion is uniform.

1-2. Operation and Advantageous Effects

Next, the operation and advantageous effects of the acoustic wave filter 10 according to the first preferred embodiment will be described in comparison to an acoustic wave filter according to a comparative example.

First, the number of electrode fingers included in the longitudinally coupled resonator unit 20 of each of the acoustic wave filters according to the first preferred embodiment and the comparative example will be described using FIG. 4. FIG. 4 is a table showing the numbers of electrode fingers included in the longitudinally coupled resonator unit 20 of the acoustic wave filter 10 according to the first preferred embodiment. Note that FIG. 4 also shows the numbers of electrode fingers included in a longitudinally coupled resonator unit of the acoustic wave filter according to the comparative example.

As shown in FIG. 4, in the longitudinally coupled resonator unit 20 of the acoustic wave filter 10 according to the first preferred embodiment, the number of electrode fingers included in the main pitch portion 31$m$ of the IDT electrode 31, which is the first IDT electrode, is 38, and the number of electrode fingers included in the main pitch portion 32$m$ of the IDT electrode 32, which is the second IDT electrode, is 50. Accordingly, in the first preferred embodiment, the first IDT electrode and the second IDT electrode differ from each other in terms of the number of electrode fingers included in the main pitch portion. In contrast, the acoustic wave filter according to the comparative example has the same or a similar configuration as the acoustic wave filter 10 according to the first preferred embodiment except for the numbers of electrode fingers in the main pitch portions of the IDT electrodes 31 and 32. As shown in FIG. 4, in the acoustic wave filter according to the comparative example, the number of electrode fingers included in each of the main pitch portions of the IDT electrodes 31 and 32 is 44.

Figure 5:
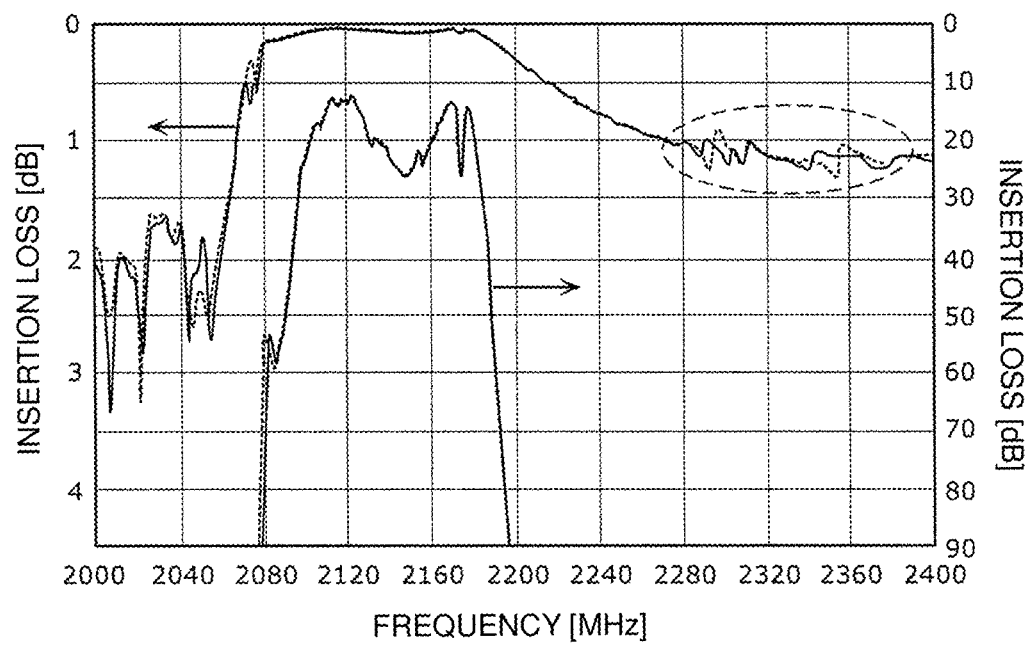
FIG. 5 is a graph showing bandpass characteristics obtained by performing a simulation on individual acoustic wave filters according to the first preferred embodiment of the present invention and a comparative example.

Here, the bandpass characteristics of each of the acoustic wave filters according to the first preferred embodiment and the comparative example will be described using FIG. 5. FIG. 5 is a graph showing bandpass characteristics obtained by performing a simulation on each of the acoustic wave filters according to the first preferred embodiment and the comparative example. The solid line graph and the dotted line graph shown in FIG. 5 respectively indicate the bandpass characteristics of the acoustic wave filter according to the first preferred embodiment and those of the acoustic wave filter according to the comparative example. Note that, in this simulation, the bandpass characteristics for a case where each IDT electrode has a multilayer structure including the first metal layer 31$a$, the second metal layer 31$b$, the third metal layer 31$c$, and the fourth metal layer 31$d$ described above are calculated.

In the graph of FIG. 5, ripples in a portion surrounded by a dotted line ellipse result from spurious responses of the acoustic wave filter. As shown in FIG. 5, the acoustic wave filter 10 according to the first preferred embodiment indicated by the solid line can reduce the peak values of the ripples more greatly than the acoustic wave filter according to the comparative example indicated by the dotted line. Accordingly, the acoustic wave filter 10 according to the first preferred embodiment is able to significantly reduce or prevent spurious responses more greatly than the acoustic wave filter according to the comparative example.

The mechanism of the spurious responses reducing effect of the acoustic wave filter 10 according to the first preferred embodiment will be described. In the acoustic wave filters according to the first preferred embodiment and the comparative example, it is assumed that, mainly, spurious responses occur due to the main pitch portion of each IDT electrode. Here, the acoustic wave filter according to the comparative example includes, at symmetric or substantially symmetric positions with respect to the center IDT electrode, a first IDT electrode and a second IDT electrode having the same or a similar configuration. Thus, spurious responses having the same or substantially the same frequency characteristics occur at the first and second IDT electrodes, and these spurious responses reinforce each other. Thus, relatively large spurious responses occur in the acoustic wave filter according to the comparative example. In contrast to this, in the acoustic wave filter 10 according to the first preferred embodiment, the number of electrode fingers of the main pitch portion of the first IDT electrode is different from that of the second IDT electrode, the first and second IDT electrodes being arranged at symmetric or substantially symmetric positions with respect to the center IDT electrode in the acoustic wave propagation direction. As a result, the frequency characteristics of spurious responses that occur at the first IDT electrode may be different from those at the second IDT electrode. Consequently, spurious responses occurring at the first IDT electrode and those occurring at the second IDT electrode can be prevented from reinforcing each other, and thus it is considered that the spurious responses of the acoustic wave filter are able to be significantly reduced or prevented.

As described above, the substrate 70 of the acoustic wave filter 10 is made of $LiNbO_3$. In this case, in the comparative example, as shown in FIG. 5, spurious responses may occur on the high-frequency side of the pass band. More specifically, in the comparative example, the stop band of the narrow-pitch portions of the first and second IDT electrodes is positioned on the high-frequency side of the pass band, and spurious responses may occur in this stop band. With the acoustic wave filter 10 according to the first preferred embodiment, such spurious responses are able to be significantly reduced or prevented.

In addition, generally, spurious responses may become larger in an unbalanced acoustic wave filter, for example, the acoustic wave filter 10 according to the first preferred embodiment than in a balanced acoustic wave filter. This is because noise due to spurious responses can be canceled out in a balanced acoustic wave filter by acquiring the difference between signals transmitted through two signal lines, and such noise is not canceled out in an unbalanced acoustic wave filter. Accordingly, in the acoustic wave filter 10, which is an unbalanced acoustic wave filter in which spurious responses become relatively large, the spurious response reducing effect achieved by making the number of electrode fingers of the main pitch portion of the first IDT electrode different from that of the second IDT electrode is especially prominent.

In addition, in the acoustic wave filter 10 according to the first preferred embodiment, the difference between the number of electrode fingers included in the main pitch portion of the first IDT electrode and that of the second IDT electrode is an even number. As a result, the difference between the numbers of electrode fingers of the main pitch portions of the first and second IDT electrodes may correspond to an integral multiple of the wavelength of the acoustic wave resonator including the IDT electrodes. Thus, the differences between the frequency characteristics in the pass band of the first IDT electrode and those in the bass band of the second IDT electrode are able to be significantly reduced.

In addition, in the acoustic wave filter 10 according to the first preferred embodiment, the parameters for the first IDT electrode are the same or substantially the same as those for the second IDT electrode except for the number of electrode fingers included in the main pitch portion. Specifically, as the electrode parameters for the first IDT electrode and the second IDT electrode, for example, the wavelength A (pitch), the line width W, the space width S, the electrode duty, the electrode height h, and the overlapping width are the same or substantially the same. As a result, an acoustic wave filter having a symmetric configuration with respect to the center IDT electrode except for the numbers of electrode fingers in the main pitch portions of the first and second IDT electrodes can be obtained. Thus, the spurious responses are able to be significantly reduced or prevented almost without degrading the bandpass characteristics compared with an acoustic wave filter designed to be perfectly symmetric with respect to the center IDT electrode.

In addition, in the acoustic wave filter 10 according to the first preferred embodiment, the numbers of electrode fingers included in the main pitch portions of the pair of IDT electrodes 33 and 34 are equal or substantially equal to each other, the IDT electrodes 33 and 34 being arranged as a pair at both ends of the IDT electrodes 30 to 34 in the acoustic wave propagation direction. As a result, the bandpass characteristics of the acoustic wave filter 10 may be closer to the bandpass characteristics of an acoustic wave filter designed to be perfectly symmetric with respect to the center IDT electrode. In addition, similarly to the IDT electrodes 33 and 34, for IDT electrodes in which a narrow-pitch portion is provided only on one side of the main pitch portion, the inventor of preferred embodiments of the present invention discovered from a simulation result that the spurious response reducing effect achieved by making the main pitch portions of the IDT electrodes have different numbers of electrode fingers from each other is negligibly small. Thus, by making the numbers of electrode fingers included in the main pitch portions of the IDT electrodes 33 and 34 equal or substantially equal to each other, the bandpass characteristics of the acoustic wave filter 10 may be closer to the bandpass characteristics of an acoustic wave filter designed to be perfectly symmetric with respect to the center IDT electrode, without increasing spurious responses.

1-3. Modifications

Next, modifications of the acoustic wave filter 10 according to the first preferred embodiment will be described. Acoustic wave filters according to the present modifications differ from the acoustic wave filter 10 in that electrode parameters for the main pitch portion and narrow-pitch portions are not uniform, and match the acoustic wave filter 10 in the other points. In the following, the configurations of IDT electrodes of the acoustic wave filters according to the modifications of the first preferred embodiment will be described using FIGS. 6, 7A, and 7B in comparison to the configuration of one of the IDT electrodes of the acoustic wave filter 10.

Figure 6:
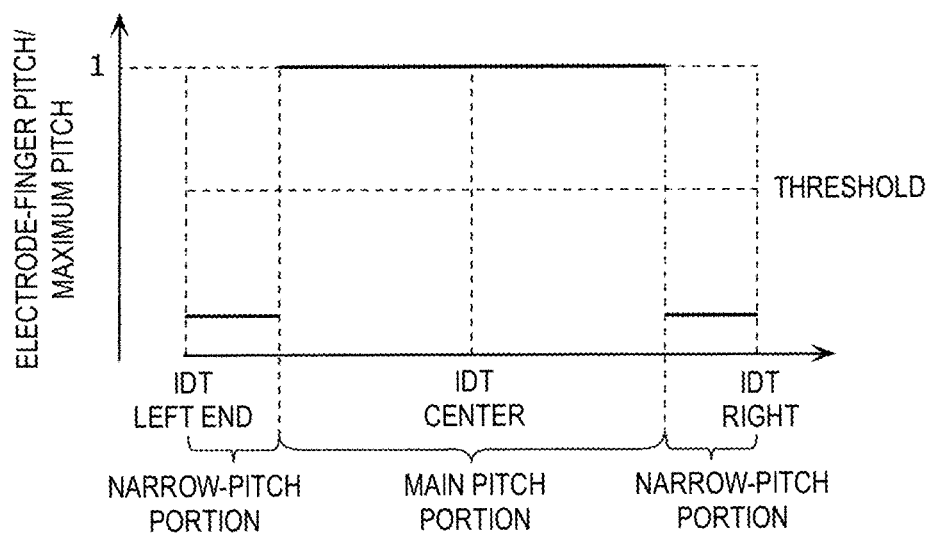
FIG. 6 is a graph showing a pitch distribution of electrode fingers of an interdigital transducer (IDT) electrode according to the first preferred embodiment of the present invention.
Figure 7A:
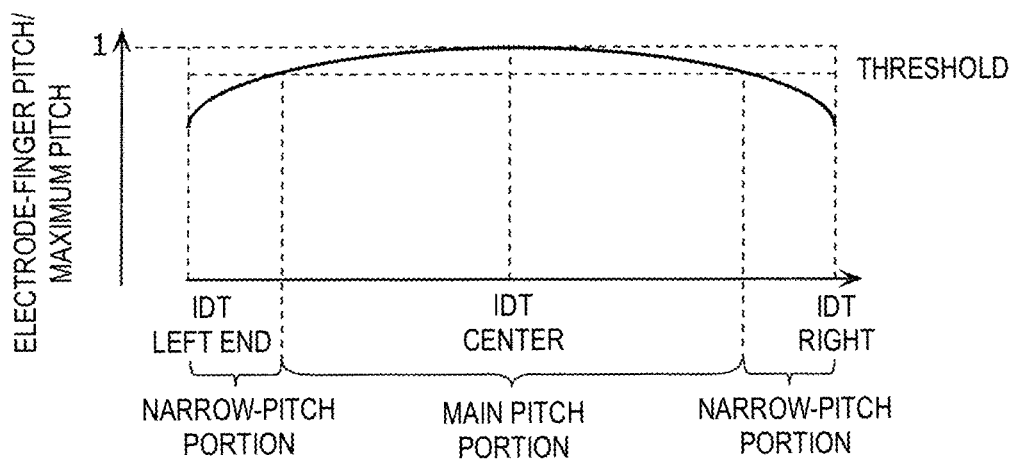
FIG. 7A is a graph showing a pitch distribution of electrode fingers of an IDT electrode according to a first modification of the first preferred embodiment of the present invention.
Figure 7B:
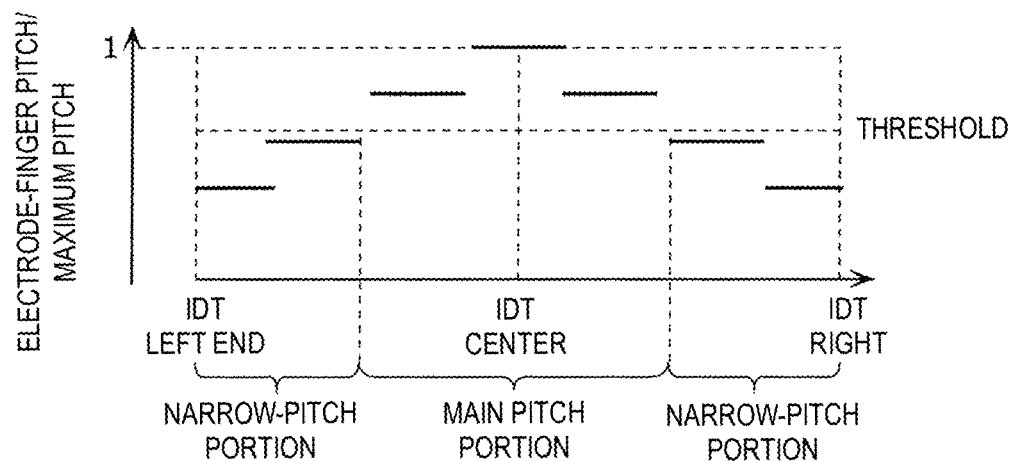
FIG. 7B is a graph showing a pitch distribution of electrode fingers of an IDT electrode according to a second modification of the first preferred embodiment of the present invention.

FIG. 6 is a graph showing the pitch distribution of the electrode fingers of one of the IDT electrodes according to the first preferred embodiment. FIG. 7A is a graph showing the pitch distribution of the electrode fingers of an IDT electrode according to a first modification of the first preferred embodiment, and FIG. 7B is a graph showing the pitch distribution of the electrode fingers of an IDT electrode according to a second modification of the first preferred embodiment. FIG. 6 shows the pitch distribution of the electrode fingers included in the first or second IDT electrode of the acoustic wave filter 10. FIG. 7A shows the pitch distribution of the electrode fingers included in a first or second IDT electrode among the five or more IDT electrodes of an acoustic wave filter according to the first modification, the first and second IDT electrodes being arranged at symmetric or substantially symmetric positions with respect to the center IDT electrode. FIG. 7B shows the pitch distribution of the electrode fingers included in a first or second IDT electrode among the five or more IDT electrodes of an acoustic wave filter according to the second modification, the first and second IDT electrodes being arranged at symmetric or substantially symmetric positions with respect to the center IDT electrode.

As shown in FIG. 6, in the IDT electrode according to the first preferred embodiment, the pitch of the electrode fingers in the main pitch portion and that in the narrow-pitch portions are each uniform or substantially uniform.

In contrast, as shown in FIG. 7A, the pitch of the electrode fingers in the main pitch portion of the IDT electrode according to the first modification reaches a maximum at the center in the acoustic wave propagation direction of the IDT electrode, and tapers off toward both ends of the IDT electrode (the left and right ends in FIG. 7A) from the center. In addition, the pitch of the electrode fingers in the narrow-pitch portions of the IDT electrode according to the first modification tapers off toward the ends from the center side in the acoustic wave propagation direction of the IDT electrode.

In addition, as shown in FIG. 7B, the pitch of the electrode fingers in the main pitch portion of the IDT electrode according to the second modification reaches a maximum at the center in the acoustic wave propagation direction of the IDT electrode, and decreases in a stepped manner toward both ends of the IDT electrode (the left and right ends in FIG. 7B) from the center. In addition, the pitch of the electrode fingers in the narrow-pitch portions of the IDT electrode according to the second modification also decreases in a stepped manner toward the ends of the IDT electrode from the center side in the acoustic wave propagation direction.

Note that, in a case where the pitch of the electrode fingers changes in three or more stages like the IDT electrodes according to the first and second modifications, a portion where the pitch of the electrode fingers is greater than or equal to a predetermined threshold may be treated as a main pitch portion and portions where the pitch of the electrode finders is less than the predetermined threshold may be treated as narrow-pitch portions. The predetermined threshold is not specifically limited. However, for example, the predetermined threshold may be the median value (in other words, the average) of the maximum pitch and the minimum pitch in the IDT electrode. Alternatively, as the predetermined threshold, the average of the pitches of the entire IDT electrode may also be used. In addition, the narrow-pitch portions may be determined by the percentage of the distance from both ends of the IDT electrode in the acoustic wave propagation direction. For example, portions covering distances of 0% or greater but not greater than 10% of the length of the IDT electrode from both ends of the IDT electrode in the propagation direction may be determined to be narrow-pitch portions.

Even in an acoustic wave filter having first and second IDT electrodes in which the pitch continuously decreases from the center toward both ends of the IDT electrodes in the acoustic wave propagation direction similarly to the IDT electrodes according to the first and second modifications, advantageous effects the same or substantially the same as those of the acoustic wave filter 10 according to the first preferred embodiment are achieved.

Second Preferred Embodiment

A multiplexer according to a second preferred embodiment of the present invention will be described. The multiplexer according to the second preferred embodiment preferably includes an acoustic wave filter according to the first preferred embodiment, the first modification, or the second modification. In the following, the multiplexer according to the second preferred embodiment will be described using FIGS. 8, 9A, and 9B.

Figure 8:
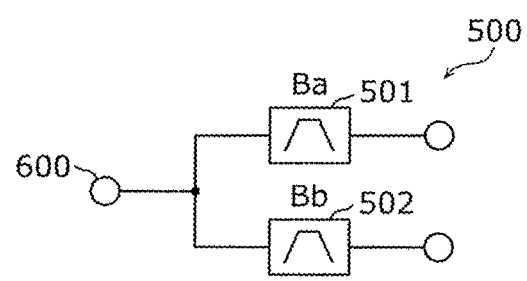
FIG. 8 is a block diagram of the configuration of a multiplexer according to a second preferred embodiment of the present invention.

FIG. 8 is a block diagram of the configuration of a multiplexer 500 according to the second preferred embodiment. As shown in FIG. 8, the multiplexer 500 includes an acoustic wave filter 501 applied to a band Ba and a frequency filter 502 applied to a band Bb. The multiplexer 500 includes a common terminal 600, and the common terminal 600 is connected to one of input-output terminals of the acoustic wave filter 501 and one of input-output terminals of the frequency filter 502.

The acoustic wave filter 501 is the acoustic wave filter according to the first preferred embodiment, the first modification, or the second modification. The acoustic wave filter 501 is applied to the band Ba included in the pass band of the acoustic wave filter 501.

The frequency filter 502 is a filter whose pass band is on the higher frequency side of the pass band of the acoustic wave filter 501. In the second preferred embodiment, the pass band of the frequency filter 502 overlaps at least a portion of a band of the acoustic wave filter 501 where spurious responses may occur. In other words, the pass band of the frequency filter 502 overlaps at least a portion of the stop band caused by the narrow-pitch portions included in the first and second IDT electrodes of the acoustic wave filter 501. The frequency filter 502 is applied to the band Bb included in the pass band of the frequency filter 502. In this case, the band Bb is a band allocated on the higher frequency side than the band Ba. The frequency filter 502 is not specifically limited as long as the frequency filter 502 is a frequency filter whose pass band includes the band Bb. The frequency filter 502 may preferably be, for example, an acoustic wave filter.

Figure 9A:
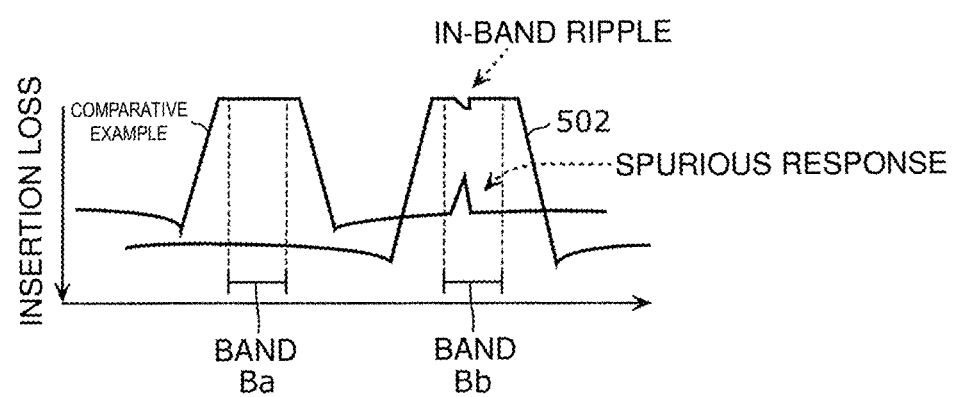
FIG. 9A is a graph showing the insertion loss of a multiplexer according to a comparative example.

Advantageous effects of the multiplexer having the above-described configuration will be described using FIGS. 9A and 9B in comparison to a comparative example. FIG. 9A is a graph showing the insertion loss of a multiplexer according to the comparative example, and FIG. 9B is a graph showing the insertion loss of the multiplexer according to the second preferred embodiment.

The multiplexer of the comparative example is different from the multiplexer 500 according to the second preferred embodiment in that the multiplexer of the comparative example includes, as an acoustic wave filter to be applied to the band Ba, the acoustic wave filter of the comparative example described in the first preferred embodiment, and matches the multiplexer 500 in the other points.

As shown in FIG. 9A, in the multiplexer of the comparative example, a spurious response occurs in the band Bb, which is on the high-frequency side of the pass band. As a result, in the insertion loss of the acoustic wave filter, a ripple is generated in a direction in which the insertion loss decreases. That is, the reflection coefficient of the acoustic wave filter decreases in the frequency band in which a ripple is generated. Together with this, also in the band Bb of the frequency filter 502, a ripple is generated in a direction in which the insertion loss increases. That is, the reflection coefficient increases in the frequency band in which a ripple for the frequency filter 502 is generated. Accordingly, in the multiplexer according to the comparative example, a ripple is generated in the insertion loss of the frequency filter 502 due to a spurious response of the acoustic wave filter, and thus the insertion loss characteristics of the multiplexer degrade.

Figure 9B:
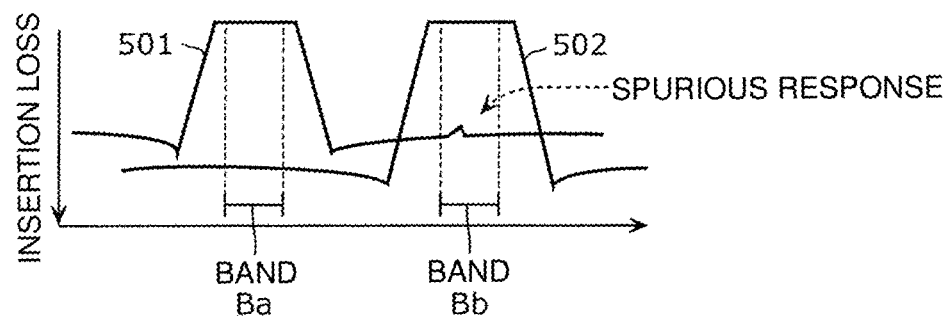
FIG. 9B is a graph showing the insertion loss of the multiplexer according to the second preferred embodiment of the present invention.

In contrast, in the multiplexer 500 according to the second preferred embodiment, as shown in FIG. 9B, a spurious response on the high-frequency side of the pass band of the acoustic wave filter 501 is able to be significantly reduced or prevented. Thus, the generation of a ripple due to a spurious response is able to be significantly reduced or prevented in the insertion loss of the frequency filter 502. Thus, with the multiplexer 500 according to the second preferred embodiment, an increase in the insertion loss is able to be significantly reduced or prevented.

Note that, in the multiplexer 500 according to the second preferred embodiment, the acoustic wave filter 501 and the frequency filter 502 are directly connected to the common terminal 600. However, the common terminal 600 may be connected to the acoustic wave filter 501 and the frequency filter 502 with a switch located therebetween, the switch selectively connecting the common terminal 600 to the acoustic wave filter 501 or the frequency filter 502. Consequently, switching of a filter to be connected to the common terminal can be performed.

Other Modifications

The acoustic wave filter 10 according to the first preferred embodiment and the multiplexer 500 according to the second preferred embodiment are described above using the preferred embodiments. However, the present invention is not limited to the above-described preferred embodiments. For example, preferred embodiments obtained by making modifications to the above-described preferred embodiments may also be included in the second invention.

For example, the configuration of the substrate 70 is not limited to the above-described configuration. As the substrate 70, a piezoelectric substrate that may generate spurious responses in a case where the substrate 70 is used in a longitudinally coupled acoustic wave filter is sufficient. For example, the material of the substrate 70 may be a piezoelectric material other than $LiNbO_3$, or the material, cut angle, and thickness of the substrate 70 may also be changed in accordance with, for example, predetermined passing characteristics of the acoustic wave filter 10. In addition, the substrate 70 does not have to be a piezoelectric single crystal substrate, and may also be, for example, a substrate having a stacked piezoelectric film.

In addition, the longitudinally coupled resonator unit 20 of the acoustic wave filter 10 according to the first preferred embodiment includes five IDT electrodes. However, as the number of IDT electrodes that the longitudinally coupled resonator unit includes, five or more is sufficient and the number of IDT electrodes is not limited to five. In addition, for example, in a case where an acoustic wave filter includes seven or more IDT electrodes that are aligned in an acoustic wave propagation direction, for not only a first IDT electrode and a second IDT electrode with respect to a center IDT electrode but also for another pair of IDT electrodes at symmetric or substantially symmetric positions in the propagation direction with respect to the center IDT electrode, the numbers of electrode fingers of the main pitch portions may be different from each other. That is, the five or more IDT electrodes included in the longitudinally coupled resonator unit include the center IDT electrode arranged at the center in the propagation direction and the third IDT electrode and the fourth IDT electrode arranged at symmetric positions in the propagation direction with respect to the center IDT electrode. Each of the third IDT electrode and the fourth IDT electrode includes a pair of narrow-pitch portions each of which includes, among the plurality of electrode fingers, electrode fingers arranged between the main pitch portion and a corresponding one of both ends of the IDT electrode in the propagation direction and that has a narrower pitch than the main pitch portion. The third IDT electrode may have a different number of electrode fingers included in the main pitch portion compared with the fourth IDT electrode. Consequently, spurious responses of the acoustic wave filter are able to be further significantly reduced or prevented.

In addition, in the first preferred embodiment, the number of electrode fingers of the main pitch portion of the IDT electrode 33 is equal or substantially equal to that of the IDT electrode 34, the IDT electrodes 33 and 34 at both ends of the five IDT electrodes in the acoustic wave propagation direction. However, in the IDT electrodes 33 and 34, in a case where the narrow-pitch portions are provided on both sides of the main pitch portion, the number of electrode fingers of the main pitch portion of the IDT electrode 33 may be different from that of the IDT electrode 34. Consequently, spurious responses of the acoustic wave filter are able to be further significantly reduced or prevented.

In addition, the case where spurious responses occur in the high-frequency side of the pass band of the acoustic wave filter is described in the first preferred embodiment. However, even in a case where spurious responses occur on the low-frequency side of the pass band, the spurious responses are able to be significantly reduced or prevented with a configuration in which the main pitch portions of the first and second IDT electrodes according to the first preferred embodiment have different numbers of electrode fingers.

In addition, the unbalanced acoustic wave filter is described in the first preferred embodiment. However, the acoustic wave filter may be of a balanced acoustic wave filter.

In addition, in the first preferred embodiment, the parameters for the first IDT electrode are the same or substantially the same as those for the second IDT electrode except for the number of electrode fingers of the main pitch portion. However, other than the number of electrode fingers of the main pitch portion, the first and second IDT electrodes may have different parameters from each other.

Preferred embodiments of the present invention may be widely used as a transmission-reception filter and a multiplexer used as a front end of a wireless communication terminal for which low loss within the pass band and high attenuation outside the pass band are preferred, for example.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An acoustic wave filter comprising:
   a piezoelectric substrate;
   a first input-output terminal and a second input-output terminal provided on the substrate; and
   a longitudinally coupled resonator unit provided on the substrate and in a path connecting the first input-output terminal and the second input-output terminal to each other; wherein
   the longitudinally coupled resonator unit includes five or more interdigital transducer (IDT) electrodes that are aligned in a propagation direction in which a predetermined acoustic wave propagates on the substrate;
   each of the five or more IDT electrodes includes a pair of substantially comb-shaped electrodes;
   the five or more IDT electrodes include a center IDT electrode located at or substantially at a center in the propagation direction and a first IDT electrode and a second IDT electrode located at symmetric or substantially symmetric positions with respect to the center IDT electrode in the propagation direction;
   each of the five or more IDT electrodes includes a main pitch portion, which includes an electrode finger provided at a position closest to a center in the propagation direction among a plurality of electrode fingers included in the IDT electrode and extending in a direction crossing the propagation direction;
   each of the first IDT electrode and the second IDT electrode includes a pair of narrow-pitch portions each including, among the plurality of electrode fingers, electrode fingers provided between the main pitch portion and a corresponding one of both ends of the IDT electrode in the propagation direction and having a narrower pitch than the main pitch portion; and
   the first IDT electrode and the second IDT electrode differ from each other in a number of electrode fingers included in the main pitch portion.

2. The acoustic wave filter according to claim 1, further comprising:
   one or more ground wires provided on the substrate; wherein
   one of the pair of substantially comb-shaped electrodes is connected to the path; and
   another one of the pair of substantially comb-shaped electrodes is connected to at least one of the one or more ground wires.

3. The acoustic wave filter according to claim 1, wherein the substrate is made of $LiNbO_3$.

4. The acoustic wave filter according to claim 1, wherein a difference between the number of electrode fingers included in the main pitch portion of the first IDT electrode and that of the second IDT electrode is an even number.

5. The acoustic wave filter according to claim 1, wherein parameters for the first IDT electrode are identical or substantially identical to those for the second IDT electrode except for the number of electrode fingers included in the main pitch portion.

6. The acoustic wave filter according to claim 1, wherein the numbers of electrode fingers included in the main pitch portions of a pair of IDT electrodes are equal or substantially equal to each other, the IDT electrodes being provided as a pair at both ends of the five or more IDT electrodes in the propagation direction.

7. A multiplexer comprising:
the acoustic wave filter according to claim 1; and
a frequency filter having a pass band on the higher frequency side of a pass band of the acoustic wave filter.

8. The acoustic wave filter according to claim 1, wherein each of the pair of substantially comb-shaped electrodes includes a busbar electrode that connects a side end of each of the plurality of electrode fingers to each other.

9. The acoustic wave filter according to claim 1, wherein, in each pair of substantially comb-shaped electrodes, the plurality of electrode fingers of a first one of the substantially comb-shaped electrodes is interdigitated with the plurality of electrode fingers of a second one of the substantially comb-shaped electrodes.

10. The acoustic wave filter according to claim 1, wherein, in each pair of substantially comb-shaped electrodes, a first one of the substantially comb-shaped electrodes is electrically connected to the first input-output terminal, and a second one of the substantially comb-shaped electrodes is electrically connected to the second input-output terminal.

11. The acoustic wave filter according to claim 1, wherein the acoustic wave filter is an unbalanced filter.

12. The acoustic wave filter according to claim 1, wherein at least one of the five or more IDT electrodes includes a multilayer structure including a plurality of metal layers.

13. The acoustic wave filter according to claim 12, wherein at least one of the plurality of metal layers is a NiCr film, a PT film, a Ti film, or an AlCu film.

14. The acoustic wave filter according to claim 1, wherein a protective layer covers each of the substantially comb-shaped electrodes.

15. The acoustic wave filter according to claim 14, wherein the protective layer is a dielectric film including silicon dioxide.

16. The acoustic wave filter according to claim 1, further comprising:
a first reflector; and
a second reflector, wherein
the five or more IDT electrodes are located between the first reflector and the second reflector in the propagation direction.

17. The acoustic wave filter according to claim 16, wherein the first reflector and the second reflector each include a plurality of electrode fingers and a busbar electrode.

* * * * *